US009324311B1

(12) United States Patent
Abdollahzadeh Milani et al.

(10) Patent No.: US 9,324,311 B1
(45) Date of Patent: Apr. 26, 2016

(54) ROBUST ADAPTIVE NOISE CANCELING (ANC) IN A PERSONAL AUDIO DEVICE

(71) Applicant: Cirrus Logic, Inc., Austin, TX (US)

(72) Inventors: Ali Abdollahzadeh Milani, Austin, TX (US); Jeffrey Alderson, Austin, TX (US); Gautham Devendra Kamath, Austin, TX (US); Yang Lu, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 7 days.

(21) Appl. No.: 14/210,537

(22) Filed: Mar. 14, 2014

Related U.S. Application Data

(60) Provisional application No. 61/787,802, filed on Mar. 15, 2013.

(51) Int. Cl.
*H03B 29/00* (2006.01)
*G10K 11/16* (2006.01)

(52) U.S. Cl.
CPC .................................... *G10K 11/16* (2013.01)

(58) Field of Classification Search
CPC ............ G10K 11/1784; G10K 11/175; G10K 2210/108; G10K 2210/3055; G10K 2210/503; G10K 2210/3039
USPC ......... 355/72; 381/56, 71.1, 71.6, 71.11, 380; 704/226; 367/95; 455/63.1; 700/94
See application file for complete search history.

(56) References Cited

U.S. PATENT DOCUMENTS

| | | | |
|---|---|---|---|
| 4,020,567 | A | 5/1977 | Webster |
| 4,926,464 | A | 5/1990 | Schley-May |
| 4,998,241 | A | 3/1991 | Brox et al. |
| 5,018,202 | A | 5/1991 | Takahashi et al. |

(Continued)

FOREIGN PATENT DOCUMENTS

| | | | |
|---|---|---|---|
| DE | 102011013343 | A1 | 9/2012 |
| EP | 0412902 | A2 | 2/1991 |

(Continued)

OTHER PUBLICATIONS

Parkins, et al., "Narrowband and broadband active control in an enclosure using the acoustic energy density", J. Acoust. Soc. Am. Jul. 2000, pp. 192-203, vol. 108, issue 1, US.

(Continued)

*Primary Examiner* — Gerald Gauthier
(74) *Attorney, Agent, or Firm* — Mitch Harris, Atty at Law, LLC; Andrew M. Harris

(57) ABSTRACT

An adaptive noise canceling (ANC) circuit adaptively generates an anti-noise signal from that is injected into the speaker or other transducer output to cause cancellation of ambient audio sounds. At least one microphone provides an error signal indicative of the noise cancellation at the transducer, and the coefficients of the adaptive filter are adapted to minimize the error signal. In order to prevent improper adaptation or instabilities in one or both of the adaptive filters, spikes are detected in the error signal by comparing the error signal to a threshold ambient noise average. Therefore, if the magnitude of the coefficient error is greater than a threshold value for an update, the update is skipped. Alternatively the step size of the updates may be reduced.

15 Claims, 5 Drawing Sheets

(56) References Cited

U.S. PATENT DOCUMENTS 5,021,753 A 6/1991 Chapman
5,044,373 A 9/1991 Northeved et al.
5,251,263 A * 10/1993 Andrea et al. ............... 381/71.6
5,278,913 A 1/1994 Delfosse et al.
5,321,759 A 6/1994 Yuan
5,337,365 A 8/1994 Hamabe et al.
5,359,662 A 10/1994 Yuan et al.
5,386,477 A 1/1995 Popovich et al.
5,410,605 A 4/1995 Sawada et al.
5,425,105 A 6/1995 Lo et al.
5,445,517 A 8/1995 Kondou et al.
5,465,413 A 11/1995 Enge et al.
5,481,615 A 1/1996 Eatwell et al.
5,548,681 A 8/1996 Gleaves et al.
5,550,925 A 8/1996 Hori et al.
5,559,893 A 9/1996 Krokstad et al.
5,586,190 A 12/1996 Trantow et al.
5,640,450 A 6/1997 Watanabe
5,668,747 A 9/1997 Ohashi
5,687,075 A 11/1997 Stothers
5,696,831 A 12/1997 Inanaga et al.
5,699,437 A 12/1997 Finn
5,706,344 A 1/1998 Finn
5,740,256 A 4/1998 Castello Da Costa et al.
5,768,124 A 6/1998 Stothers et al.
5,815,582 A 9/1998 Claybaugh et al.
5,832,095 A 11/1998 Daniels
5,852,667 A 12/1998 Pan et al.
5,909,498 A 6/1999 Smith
5,940,519 A 8/1999 Kuo
5,946,391 A 8/1999 Dragwidge et al.
5,991,418 A 11/1999 Kuo
6,041,126 A 3/2000 Terai et al.
6,118,878 A 9/2000 Jones
6,181,801 B1 * 1/2001 Puthuff .................. H04B 1/385 381/328
6,219,427 B1 4/2001 Kates et al.
6,278,786 B1 8/2001 McIntosh
6,282,176 B1 8/2001 Hemkumar
6,304,179 B1 10/2001 Lotito et al.
6,418,228 B1 7/2002 Terai et al.
6,434,246 B1 8/2002 Kates et al.
6,434,247 B1 8/2002 Kates et al.
6,445,799 B1 * 9/2002 Taenzer ............. G10K 11/1782 381/381
6,522,746 B1 2/2003 Marchok et al.
6,542,436 B1 * 4/2003 Myllyla .................. G01S 7/527 340/686.6
6,650,701 B1 11/2003 Hsiang et al.
6,683,960 B1 1/2004 Fujii et al.
6,738,482 B1 5/2004 Jaber
6,766,292 B1 7/2004 Chandran
6,768,795 B2 7/2004 Feltstrom et al.
6,792,107 B2 9/2004 Tucker et al.
6,850,617 B1 2/2005 Weigand
6,940,982 B1 9/2005 Watkins
7,016,504 B1 3/2006 Shennib
7,058,463 B1 6/2006 Ruha et al.
7,103,188 B1 9/2006 Jones
7,181,030 B2 2/2007 Rasmussen et al.
7,330,739 B2 2/2008 Somayajula
7,365,669 B1 4/2008 Melanson
7,466,838 B1 12/2008 Moseley
7,680,456 B2 3/2010 Muhammad et al.
7,742,746 B2 * 6/2010 Xiang ...................... H03G 3/32 381/71.7
7,742,790 B2 6/2010 Konchitsky et al.
7,817,808 B2 10/2010 Konchitsky et al.
7,953,231 B2 5/2011 Ishida
8,019,050 B2 9/2011 Mactavish et al.
8,085,966 B2 12/2011 Amsel
D666,169 S 8/2012 Tucker et al.
8,249,262 B2 8/2012 Chua et al.
8,251,903 B2 8/2012 LeBoeuf et al.
8,290,537 B2 10/2012 Lee et al.
8,325,934 B2 12/2012 Kuo
8,331,604 B2 12/2012 Saito et al.
8,379,884 B2 2/2013 Horibe et al.
8,401,200 B2 3/2013 Tiscareno et al.
8,442,251 B2 5/2013 Jensen et al.
8,559,661 B2 10/2013 Tanghe
8,600,085 B2 12/2013 Chen et al.
8,775,172 B2 7/2014 Konchitsky et al.
8,804,974 B1 8/2014 Melanson
8,831,239 B2 9/2014 Bakalos
8,842,848 B2 9/2014 Donaldson et al.
8,855,330 B2 10/2014 Taenzer
8,908,877 B2 12/2014 Abdollahzadeh Milani et al.
8,948,407 B2 * 2/2015 Alderson et al. ........... 381/71.11
9,066,176 B2 6/2015 Hendrix et al.
9,071,724 B2 6/2015 Do et al.
9,076,431 B2 * 7/2015 Kamath et al.
9,106,989 B2 * 8/2015 Li .......................... H04R 3/002
9,107,010 B2 * 8/2015 Abdollahzadeh Milani ................ G10L 21/0224
9,129,586 B2 9/2015 Bajic et al.
2001/0053228 A1 12/2001 Jones
2002/0003887 A1 1/2002 Zhang et al.
2003/0063759 A1 4/2003 Brennan et al.
2003/0072439 A1 4/2003 Gupta
2003/0185403 A1 10/2003 Sibbald
2004/0047464 A1 3/2004 Yu et al.
2004/0120535 A1 6/2004 Woods
2004/0165736 A1 8/2004 Hetherington et al.
2004/0167777 A1 8/2004 Hetherington et al.
2004/0202333 A1 10/2004 Csermak et al.
2004/0240677 A1 12/2004 Onishi et al.
2004/0242160 A1 12/2004 Ichikawa et al.
2004/0264706 A1 12/2004 Ray et al.
2005/0004796 A1 1/2005 Trump et al.
2005/0018862 A1 1/2005 Fisher
2005/0117754 A1 6/2005 Sakawaki
2005/0240401 A1 10/2005 Ebenezer
2006/0035593 A1 2/2006 Leeds
2006/0055910 A1 * 3/2006 Lee ................................ 355/72
2006/0069556 A1 3/2006 Nadjar et al.
2006/0153400 A1 7/2006 Fujita et al.
2006/0159282 A1 7/2006 Borsch
2006/0161428 A1 7/2006 Fouret
2006/0251266 A1 11/2006 Saunders et al.
2007/0030989 A1 2/2007 Kates
2007/0033029 A1 2/2007 Sakawaki
2007/0038441 A1 2/2007 Inoue et al.
2007/0047742 A1 3/2007 Taenzer et al.
2007/0053524 A1 3/2007 Haulick et al.
2007/0076896 A1 4/2007 Hosaka et al.
2007/0154031 A1 7/2007 Avendano et al.
2007/0258597 A1 11/2007 Rasmussen et al.
2007/0297620 A1 12/2007 Choy
2008/0019548 A1 1/2008 Avendano
2008/0101589 A1 5/2008 Horowitz et al.
2008/0107281 A1 5/2008 Togami et al.
2008/0144853 A1 6/2008 Sommerfeldt et al.
2008/0177532 A1 7/2008 Greiss et al.
2008/0181422 A1 7/2008 Christoph
2008/0226098 A1 9/2008 Haulick et al.
2008/0240413 A1 10/2008 Mohammad et al.
2008/0240455 A1 10/2008 Inoue et al.
2008/0240457 A1 10/2008 Inoue et al.
2008/0269926 A1 * 10/2008 Xiang ...................... H03G 3/32 700/94
2009/0012783 A1 * 1/2009 Klein ............................ 704/226
2009/0034748 A1 2/2009 Sibbald
2009/0041260 A1 2/2009 Jorgensen et al.
2009/0046867 A1 2/2009 Clemow
2009/0060222 A1 3/2009 Jeong et al.
2009/0080670 A1 3/2009 Solbeck et al.
2009/0086990 A1 4/2009 Christoph
2009/0175466 A1 7/2009 Elko et al.
2009/0196429 A1 8/2009 Ramakrishnan et al.
2009/0220107 A1 9/2009 Every et al.
2009/0238369 A1 9/2009 Ramakrishnan et al.
2009/0245529 A1 10/2009 Asada et al.
2009/0254340 A1 10/2009 Sun et al.

(56) References Cited

U.S. PATENT DOCUMENTS

2009/0290718 A1 11/2009 Kahn et al.
2009/0296965 A1 12/2009 Kojima
2009/0304200 A1 12/2009 Kim et al.
2009/0311979 A1 12/2009 Husted et al.
2010/0002891 A1 1/2010 Shiraishi et al.
2010/0014683 A1 1/2010 Maeda et al.
2010/0014685 A1* 1/2010 Wurm ........................ 381/71.11
2010/0061564 A1 3/2010 Clemow et al.
2010/0069114 A1 3/2010 Lee et al.
2010/0082339 A1 4/2010 Konchitsky et al.
2010/0098263 A1 4/2010 Pan et al.
2010/0098265 A1 4/2010 Pan et al.
2010/0124335 A1 5/2010 Wessling et al.
2010/0124336 A1 5/2010 Shridhar et al.
2010/0124337 A1 5/2010 Wertz et al.
2010/0131269 A1 5/2010 Park et al.
2010/0142715 A1* 6/2010 Goldstein et al. ............... 381/56
2010/0150367 A1 6/2010 Mizuno
2010/0158330 A1 6/2010 Guissin et al.
2010/0166203 A1 7/2010 Peissig et al.
2010/0195838 A1 8/2010 Bright
2010/0195844 A1* 8/2010 Christoph et al. ......... 381/71.11
2010/0207317 A1 8/2010 Iwami et al.
2010/0239126 A1 9/2010 Grafenberg et al.
2010/0246855 A1 9/2010 Chen
2010/0260345 A1 10/2010 Shridhar et al.
2010/0266137 A1 10/2010 Sibbald et al.
2010/0272276 A1 10/2010 Carreras et al.
2010/0272283 A1 10/2010 Carreras et al.
2010/0274564 A1 10/2010 Bakalos et al.
2010/0284546 A1 11/2010 DeBrunner et al.
2010/0291891 A1 11/2010 Ridgers et al.
2010/0296666 A1 11/2010 Lin
2010/0296668 A1 11/2010 Lee et al.
2010/0310086 A1 12/2010 Magrath et al.
2010/0322430 A1 12/2010 Isberg
2011/0007907 A1 1/2011 Park et al.
2011/0026724 A1 2/2011 Doclo
2011/0106533 A1 5/2011 Yu
2011/0116654 A1 5/2011 Chan et al.
2011/0129098 A1 6/2011 Delano et al.
2011/0130176 A1 6/2011 Magrath et al.
2011/0142247 A1 6/2011 Fellers et al.
2011/0144984 A1 6/2011 Konchitsky
2011/0158419 A1* 6/2011 Theverapperuma et al. 381/71.1
2011/0206214 A1 8/2011 Christoph et al.
2011/0222698 A1 9/2011 Asao et al.
2011/0249826 A1 10/2011 Van Leest
2011/0288860 A1 11/2011 Schevciw et al.
2011/0293103 A1 12/2011 Park et al.
2011/0299695 A1 12/2011 Nicholson
2011/0305347 A1 12/2011 Wurm
2011/0317848 A1 12/2011 Ivanov et al.
2012/0135787 A1 5/2012 Kusunoki et al.
2012/0140917 A1 6/2012 Nicholson et al.
2012/0140942 A1 6/2012 Loeda
2012/0140943 A1* 6/2012 Hendrix et al. ............ 381/71.11
2012/0148062 A1 6/2012 Scarlett et al.
2012/0155666 A1 6/2012 Nair
2012/0170766 A1 7/2012 Alves et al.
2012/0207317 A1* 8/2012 Abdollahzadeh Milani et al. ............................ 381/71.6
2012/0215519 A1 8/2012 Park et al.
2012/0250873 A1* 10/2012 Bakalos et al. .............. 381/71.6
2012/0259626 A1 10/2012 Li et al.
2012/0263317 A1 10/2012 Shin et al.
2012/0281850 A1 11/2012 Hyatt
2012/0300955 A1 11/2012 Iseki et al.
2012/0300958 A1 11/2012 Klemmensen
2012/0300960 A1 11/2012 Mackay et al.
2012/0308021 A1 12/2012 Kwatra et al.
2012/0308025 A1 12/2012 Hendrix et al.
2012/0308026 A1 12/2012 Kamath et al.
2012/0308027 A1 12/2012 Kwatra
2012/0308028 A1 12/2012 Kwatra et al.
2012/0310640 A1 12/2012 Kwatra et al.
2013/0010982 A1 1/2013 Elko et al.
2013/0083939 A1 4/2013 Fellers et al.
2013/0195282 A1 8/2013 Ohita et al.
2013/0243198 A1 9/2013 Van Rumpt
2013/0243225 A1 9/2013 Yokota
2013/0272539 A1 10/2013 Kim et al.
2013/0287218 A1 10/2013 Alderson et al.
2013/0287219 A1 10/2013 Hendrix et al.
2013/0301842 A1 11/2013 Hendrix et al.
2013/0301846 A1 11/2013 Alderson et al.
2013/0301847 A1 11/2013 Alderson et al.
2013/0301848 A1 11/2013 Zhou et al.
2013/0301849 A1 11/2013 Alderson et al.
2013/0315403 A1 11/2013 Samuelsson
2013/0343556 A1 12/2013 Bright
2013/0343571 A1 12/2013 Rayala et al.
2014/0016803 A1 1/2014 Puskarich
2014/0036127 A1 2/2014 Pong et al.
2014/0044275 A1 2/2014 Goldstein et al.
2014/0050332 A1 2/2014 Nielsen et al.
2014/0072134 A1 3/2014 Po et al.
2014/0086425 A1 3/2014 Jensen et al.
2014/0146976 A1 5/2014 Rundle
2014/0169579 A1 6/2014 Azmi
2014/0177851 A1 6/2014 Kitazawa et al.
2014/0211953 A1 7/2014 Alderson et al.
2014/0226827 A1* 8/2014 Abdollahzadeh Milani ................ G10L 21/0224 381/56
2014/0270222 A1* 9/2014 Hendrix ................... H04R 1/24 381/71.6
2014/0270223 A1* 9/2014 Li .......................... H04R 3/002 381/71.6
2014/0270224 A1 9/2014 Zhou et al.
2014/0294182 A1 10/2014 Axelsson et al.
2014/0307887 A1 10/2014 Alderson
2014/0307888 A1 10/2014 Alderson et al.
2014/0307890 A1 10/2014 Zhou et al.
2014/0314244 A1 10/2014 Yong
2014/0314247 A1 10/2014 Zhang
2014/0369517 A1 12/2014 Zhou et al.
2015/0092953 A1 4/2015 Abdollahzadeh Milani et al.
2015/0161981 A1 6/2015 Kwatra

FOREIGN PATENT DOCUMENTS

EP 1691577 A2 8/2006
EP 1880699 A2 1/2008
EP 1947642 A1 7/2008
EP 2133866 A1 12/2009
EP 2216774 A1 8/2010
EP 2237573 A1 10/2010
EP 2395500 A1 12/2011
EP 2395501 A1 12/2011
EP 2551845 A1 1/2013
GB 2401744 A 11/2004
GB 2436657 A 10/2007
GB 2455821 A 6/2009
GB 2455824 A 6/2009
GB 2455828 A 6/2009
GB 2484722 A 4/2012
JP H06-186985 A 7/1994
JP 07104769 4/1995
JP 07240989 9/1995
JP 07325588 12/1995
WO WO 9113429 9/1991
WO WO 9911045 3/1999
WO WO 03/015074 A1 2/2003
WO WO 03015275 A1 2/2003
WO WO 2004009007 A1 1/2004
WO WO 2004017303 A1 2/2004
WO WO 2006128768 A1 12/2006
WO WO 2007007916 A1 1/2007
WO WO 2007011337 1/2007
WO WO 2007110807 A2 10/2007
WO WO 2007113487 A1 11/2007
WO WO 2010117714 A1 10/2010

(56) References Cited

FOREIGN PATENT DOCUMENTS

| | | | |
|---|---|---|---|
| WO | WO 2010131154 | A1 | 11/2010 |
| WO | WO 2012134874 | A1 | 10/2012 |
| WO | WO 2015038255 | A1 | 3/2015 |

OTHER PUBLICATIONS

Feng, et al.., "A broadband self-tuning active noise equaliser", Signal Processing, Oct. 1, 1997, pp. 251-256, vol. 62, No. 2, Elsevier Science Publishers B.V. Amsterdam, NL.
Zhang, et al., "A Robust Online Secondary Path Modeling Method with Auxiliary Noise Power Scheduling Strategy and Norm Constraint Manipulation", IEEE Transactions on Speech and Audio Processing, IEEE Service Center, Jan. 1, 2003, pp. 45-53, vol. 11, No. 1, NY.
Lopez-Gaudana, et al., "A hybrid active noise cancelling with secondary path modeling", 51st Midwest Symposium on Circuits and Systems, MWSCAS 2008, Aug. 10-13, 2008, pp. 277-280, IEEE, Knoxville, TN.
U.S. Appl. No. 14/578,567, filed Dec. 22, 2014, Kwatra, et al.
Widrow, B., et al., Adaptive Noise Cancelling; Principles and Applications, Proceedings of the IEEE, Dec. 1975, pp. 1692-1716, vol. 63, No. 13, IEEE, New York, NY, US.
Morgan, et al., A Delayless Subband Adaptive Filter Architecture, IEEE Transactions on Signal Processing, IEEE Service Center, Aug. 1995, pp. 1819-1829, vol. 43, No. 8, New York, NY, US.
Abdollahzadeh Milani, et al., "On Maximum Achievable Noise Reduction in ANC Systems",2010 IEEE International Conference on Acoustics Speech and Signal Processing, Mar. 14-19, 2010, pp. 349-352, Dallas, TX, US.
U.S. Appl. No. 14/228,322, filed Mar. 28, 2014, Alderson, et al.
U.S. Appl. No. 13/762,504, filed Feb. 8, 2013, Abdollahzadeh Milani, et al.
U.S. Appl. No. 13/721,832, filed Dec. 20, 2012, Lu, et al.
U.S. Appl. No. 13/724,656, filed Dec. 21, 2012, Lu, et al.
U.S. Appl. No. 14/252,235, filed Apr. 14, 2014, Lu, et al.
U.S. Appl. No. 13/968,013, filed Aug. 15, 2013, Abdollahzadeh Milani, et al.
U.S. Appl. No. 13/924,935, filed Jun. 24, 2013, Hellman.
U.S. Appl. No. 13/896,526, filed May 17, 2013, Naderi.
U.S. Appl. No. 14/101,955, filed Dec. 10, 2013, Alderson.
U.S. Appl. No. 14/101,777, filed Dec. 10, 2013, Alderson et al.
Cohen, Israel, "Noise Spectrum Estimation in Adverse Environments: Improved Minima Controlled Recursive Averaging", IEEE Transactions on Speech and Audio Processing, Sep. 2003, pp. 1-11, vol. 11, Issue 5, Piscataway, NJ, US.
Ryan, et al., "Optimum Near-Field Performance of Microphone Arrays Subject to a Far-Field Beampattern Constraint", J. Acoust. Soc. Am., Nov. 2000, pp. 2248-2255, 108 (5), Pt. 1, Ottawa, Ontario, Canada.
Cohen, et al., "Noise Estimation by Minima Controlled Recursive Averaging for Robust Speech Enhancement", IEEE Signal Processing Letters, Jan. 2002, pp. 12-15, vol. 9, No. 1, Piscataway, NJ, US.
Martin, Rainer, "Noise Power Spectral Density Estimation Based on Optimal Smoothing and Minimum Statistics", IEEE Transactions on Speech and Audio Processing, Jul. 2001, pp. 504-512, vol. 9, No. 5, Piscataway, NJ, US.
Martin, Rainer, "Spectral Subtraction Based on Minimum Statistics", Signal Processing VII Theories and Applications, Proceedings of EUSIPCO-94, 7th European Signal Processing Conference, Sep. 13-16, 1994, pp. 1182-1185, vol. III, Edinburgh, Scotland, U.K.
Booij, et al., "Virtual sensors for local, three dimensional, broadband multiple-channel active noise control and the effects on the quiet zones", Proceedings of the International Conference on Noise and Vibration Engineering, ISMA 2010, Sep. 20-22, 2010, pp. 151-166, Leuven.
Kuo, et al., "Residual noise shaping technique for active noise control systems", J. Acoust. Soc. Am. 95 (3), Mar. 1994, pp. 1665-1668.
Lopez-Caudana, Edgar Omar, "Active Noise Cancellation: The Unwanted Signal and The Hybrid Solution", Adaptive Filtering Applications, Dr. Lino Garcia (Ed.), Jul. 2011, pp. 49-84, ISBN: 978-953-307306-4, InTech.
Senderowicz, et al., "Low-Voltage Double-Sampled Delta-Sigma Converters", IEEE Journal on Solid-State Circuits, Dec. 1997, pp. 1907-1919, vol. 32, No. 12, Piscataway, NJ.
Hurst, et al., "An improved double sampling scheme for switched-capacitor delta-sigma modulators", 1992 IEEE Int. Symp. on Circuits and Systems, May 10-13, 1992, vol. 3, pp. 1179-1182, San Diego, CA.
U.S. Appl. No. 14/656,124, filed Mar. 12, 2015, Hendrix, et al.
Campbell, Mikey, "Apple looking into self-adjusting earbud headphones with noise cancellation tech", Apple Insider, Jul. 4, 2013, pp. 1-10 (10 pages in pdf), downloaded on May 14, 2014 from http://appleinsider.com/articles/13/07/04/apple-looking-into-self-adjusting-earbud-headphones-with-noise-cancellation-tech.
Jin, et al. "A simultaneous equation method-based online secondary path modeling algorithm for active noise control", Journal of Sound and Vibration, Apr. 25, 2007, pp. 455-474, vol. 303, No. 3-5, London, GB.
Erkelens, et al., "Tracking of Nonstationary Noise Based on Data-Driven Recursive Noise Power Estimation", IEEE Transactions on Audio Speech and Language Processing, Aug. 2008, pp. 1112-1123, vol. 16, No. 6, Piscataway, NJ, US.
Rao, et al., "A Novel Two State Single Channel Speech Enhancement Technique", India Conference. (INDICON) 2011 Annual IEEE, IEEE, Dec. 2011, 6 pages (pp. 1-6 in pdf), Piscataway, NJ, US.
Rangachari, et al., "A noise-estimation algorithm for highly non-stationary environments", Speech Communication, Feb. 2006, pp. 220-231, vol. 48, No. 2. Elsevier Science Publishers.
U.S. Appl. No. 13/686,353, filed Nov. 27, 2012, Hendrix, et al.
U.S. Appl. No. 13/795,160, filed Mar. 12, 2013, Hendrix, et al.
U.S. Appl. No. 13/692,367, filed Dec. 3, 2012, Alderson, et al.
U.S. Appl. No. 13/722,119, filed Dec. 20, 2012, Hendrix, et al.
U.S. Appl. No. 13/727,718, filed Dec. 27, 2012, Alderson, et al.
U.S. Appl. No. 13/784,018, filed Mar. 4, 2013, Alderson, et al.
U.S. Appl. No. 13/787,906, filed Mar. 7, 2013, Alderson, et al.
U.S. Appl. No. 13/729,141, filed Dec. 28, 2012, Zhou, et al.
U.S. Appl. No. 13/794,931, filed Mar. 12, 2013, Lu, et al.
U.S. Appl. No. 13/794,979, filed Mar. 12, 2013, Alderson, et al.
U.S. Appl. No. 13/968,007, filed Aug. 15, 2013, Hendrix, et al.
U.S. Appl. No. 14/029,159, filed Sep. 17, 2013, Li, et al.
U.S. Appl. No. 14/062,951, filed Oct. 25, 2013, Zhou, et al.
U.S. Appl. No. 14/197,814, filed Mar. 5, 2014, Kaller, et al.
U.S. Appl. No. 14/210,589, filed Mar. 14, 2014, Abdollahzadeh Milani, et al.
Black, John W., "An Application of Side-Tone in Subjective Tests of Microphones and Headsets", Project Report No. NM 001 064.01.20, Research Report of the U.S. Naval School of Aviation Medicine, Feb. 1, 1954, 12 pages (pp. 1-12 in pdf), Pensacola, FL, US.
Peters, Robert W., "The Effect of High-Pass and Low-Pass Filtering of Side-Tone Upon Speaker Intelligibility", Project Report No. NM 001 064.01.25, Research Report of the U.S. Naval School of Aviation Medicine, Aug. 16, 1954, 13 pages (pp. 1-13 in pdf), Pensacola, FL, US.
Lane, et al., "Voice Level: Autophonic Scale, Perceived Loudness, and the Effects of Sidetone", The Journal of the Acoustical Society of America, Feb. 1961, pp. 160-167, vol. 33, No. 2., Cambridge, MA, US.
Liu, et al., "Compensatory Responses to Loudness-shifted Voice Feedback During Production of Mandarin Speech", Journal of the Acoustical Society of America, Oct. 2007, pp. 2405-2412, vol. 122, No. 4.
Paepcke, et al., "Yelling in the Hall: Using Sidetone to Address a Problem with Mobile Remote Presence Systems", Symposium on User Interface Software and Technology, Oct. 16-19, 2011, 10 pages (pp. 110 in pdf), Santa Barbara, CA, US.
Therrien, et al., "Sensory Attenuation of Self-Produced Feedback: The Lombard Effect Revisited", PLOS One, Nov. 2012, pp. 1-7, vol. 7, Issue 11, e49370, Ontario, Canada.

(56) References Cited

OTHER PUBLICATIONS

Pfann, et al., "LMS Adaptive Filtering with Delta-Sigma Modulated Input Signals," IEEE Signal Processing Letters, Apr. 1998, pp. 95-97, vol. 5, No. 4, IEEE Press, Piscataway, NJ.
Toochinda, et al. "A Single-Input Two-Output Feedback Formulation for ANC Problems," Proceedings of the 2001 American Control Conference, Jun. 2001, pp. 923-928, vol. 2, Arlington, VA.
Kuo, et al., "Active Noise Control: A Tutorial Review," Proceedings of the IEEE, Jun. 1999, pp. 943-973, vol. 87, No. 6, IEEE Press, Piscataway, NJ.
Johns, et al., "Continuous-Time LMS Adaptive Recursive Filters," IEEE Transactions on Circuits and Systems, Jul. 1991, pp. 769-778, vol. 38, No. 7, IEEE Press, Piscataway, NJ.
Shoval, et al., "Comparison of DC Offset Effects in Four LMS Adaptive Algorithms," IEEE Transactions on Circuits and Systems II: Analog and Digital Processing, Mar. 1995, pp. 176-185, vol. 42, Issue 3, IEEE Press, Piscataway, NJ.
Mali, Dilip, "Comparison of DC Offset Effects on LMS Algorithm and its Derivatives," International Journal of Recent Trends in Engineering, May 2009, pp. 323-328, vol. 1, No. 1, Academy Publisher.
Kates, James M., "Principles of Digital Dynamic Range Compression," Trends in Amplification, Spring 2005, pp. 45-76, vol. 9, No. 2, Sage Publications.
Gao, et al., "Adaptive Linearization of a Loudspeaker," IEEE International Conference on Acoustics, Speech, and Signal Processing, Apr. 14-17, 1991, pp. 3589-3592, Toronto, Ontario, CA.
Silva, et al., "Convex Combination of Adaptive Filters With Different Tracking Capabilities," IEEE International Conference on Acoustics, Speech, and Signal Processing, Apr. 15-20, 2007, pp. III 925-928, vol. 3, Honolulu, HI, USA.
Akhtar, et al., "A Method for Online Secondary Path Modeling in Active Noise Control Systems," IEEE International Symposium on Circuits and Systems, May 23-26, 2005, pp. 264-267, vol. 1, Kobe, Japan.
Davari, et al., "A New Online Secondary Path Modeling Method for Feedforward Active Noise Control Systems," IEEE International Conference on Industrial Technology, Apr. 21-24, 2008, pp. 1-6, Chengdu, China.
Lan, et al., "An Active Noise Control System Using Online Secondary Path Modeling With Reduced Auxiliary Noise," IEEE Signal Processing Letters, Jan. 2002, pp. 16-18, vol. 9, Issue 1, IEEE Press, Piscataway, NJ.
Liu, et al., "Analysis of Online Secondary Path Modeling With Auxiliary Noise Scaled by Residual Noise Signal," IEEE Transactions on Audio, Speech and Language Processing, Nov. 2010, pp. 1978-1993, vol. 18, Issue 8, IEEE Press, Piscataway, NJ.
U.S. Appl. No. 14/734,321, filed Jun. 9, 2015, Alderson, et al.
U.S. Appl. No. 14/840,861, Aug. 31, 2015, Hendrix, et al.
Rafaely, Boaz, "Active Noise Reducing Headset—an Overview", The 2001 International Congress and Exhibition on Noice Control Engineering, Aug. 27-30, 2001, 10 pages (pp. 1-10 in pdf), The Netherlands.
Ray, et al., "Hybrid Feedforward-Feedback Active Noise Reduction for Hearing Protection and Communication", The Journal of the Acoustical Society of America, American Institute of Physics for the Acoustical Society of America, Jan. 2006, pp. 2026-2036 vol. 120, No. 4, New York, NY.

* cited by examiner

ROBUST ADAPTIVE NOISE CANCELING (ANC) IN A PERSONAL AUDIO DEVICE

This U.S. Patent Application claims priority under 35 U.S.C. 119(e) to U.S. Provisional Patent Application Ser. No. 61/787,802 filed on Mar. 15, 2013.

BACKGROUND OF THE INVENTION

1. Field of the Invention

The present invention relates generally to personal audio devices such as headphones that include adaptive noise cancellation (ANC), and, more specifically, to architectural features of an ANC system in which the update of one or more acoustical path estimates is tailored to avoid instability due to external changes.

2. Background of the Invention

Telephones, such as mobile/cellular telephones, cordless telephones, and other consumer audio devices, such as personal audio players, are in widespread use. Performance of such devices with respect to intelligibility can be improved by providing noise canceling using a reference microphone to measure ambient acoustic events and then using signal processing to insert an anti-noise signal into the output of the device to cancel the ambient acoustic events. Other audio devices may also benefit from noise canceling, or may be provided for the purpose of noise canceling.

Since the acoustic environment around personal audio devices can change dramatically, depending on the sources of noise that are present and the position of the device itself, it is desirable to adapt the noise canceling to take into account such environmental changes. In some cases, adaptive noise canceling circuits can generate undesirable results under certain circumstances.

Therefore, it would be desirable to provide a personal audio device, including a telephone that provides robust noise cancellation that is effective and/or does not generate undesirable responses when external conditions change.

SUMMARY OF THE INVENTION

The above-stated objectives of providing a personal audio device having robust performance in response to changing external conditions is accomplished in a personal audio system, a method of operation, and an integrated circuit.

The personal audio device includes an output transducer for reproducing an audio signal that includes both source audio for playback to a listener, and an anti-noise signal for countering the effects of ambient audio sounds in an acoustic output of the transducer. The personal audio device also includes the integrated circuit to provide adaptive noise-canceling (ANC) functionality. The method is a method of operation of the personal audio system and integrated circuit. A microphone is mounted on the device housing to provide a microphone signal indicative of the ambient audio sounds at the output of the transducer. An ANC processing circuit adaptively generates an anti-noise signal in conformity with the microphone signal, so that ambient audio sounds are canceled. The processing circuit adapts the response of the adaptive filter by adjusting the coefficients of the at least one adaptive filter according to an error signal generated from the microphone signal. If the magnitude of the error is greater than a threshold value, the processing circuit ceases updating of the coefficients of the at least one adaptive filter, reducing disruption of operation by samples that might otherwise destabilize the control of the adaptive filter or otherwise generate an undesirable response. The threshold value may be determined from an average value of the error signal.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

Noise canceling techniques and circuits that can be implemented in a personal audio device, such as a wireless telephone, are disclosed. The personal audio device includes an adaptive noise canceling (ANC) circuit that measures the ambient acoustic environment and generates a signal that is injected into the speaker (or other transducer) output to cancel ambient acoustic events using at least one adaptive filter. A microphone is provided to measure the ambient acoustic environment at the transducer output giving an indication of the effectiveness of the noise cancelation. An error signal generated from the microphone output is used to control adaptation of the response of the adaptive filter to minimize the error signal. An additional secondary path estimating adaptive filter may be used to remove the playback audio from the error microphone signal in order to generate the error signal. In order to prevent improper adaptation or instabilities in one or both of the adaptive filters, the cost function of the adaptive filters is modified, such that if the magnitude of the error signal is greater than a threshold value for an update, the update is skipped. The threshold may be determined as a measurement of ambient noise, so that in high noise conditions, the error is allowed to be larger while still updating the filter coefficients.

Figure 1:
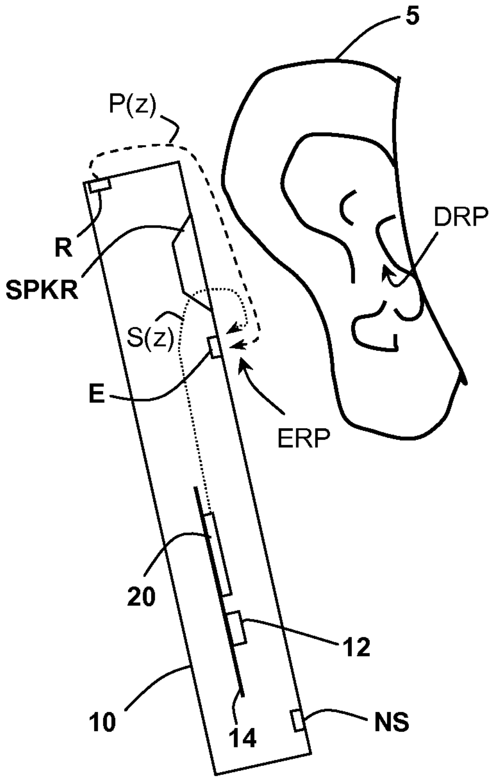
FIG. 1 is an illustration of a wireless telephone 10 that provides an example of a personal audio device as disclosed herein

Referring now to FIG. 1, a wireless telephone 10 is illustrated in proximity to a human ear 5. Illustrated wireless telephone 10 is an example of a device in which techniques disclosed herein may be employed, but it is understood that not all of the elements or configurations embodied in illustrated wireless telephone 10, or in the circuits depicted in subsequent illustrations, are required in order to practice the claims. Wireless telephone 10 includes a transducer such as a speaker SPKR that reproduces distant speech received by wireless telephone 10, along with other local audio events such as ringtones, stored audio program material, injection of near-end speech (i.e., the speech of the user of wireless telephone 10) to provide a balanced conversational perception, and other audio that requires reproduction by wireless telephone 10, such as sources from web-pages or other network communications received by wireless telephone 10 and audio indications such as battery low and other system event notifications. A near speech microphone NS is provided to capture near-end speech, which is transmitted from wireless telephone 10 to the other conversation participant(s).

Wireless telephone 10 includes adaptive noise canceling (ANC) circuits and features that inject an anti-noise signal into speaker SPKR to improve intelligibility of the distant speech and other audio reproduced by speaker SPKR. A reference microphone R is provided for measuring the ambient acoustic environment, and is positioned away from the typical position of a user's mouth, so that the near-end speech is minimized in the signal produced by reference microphone R. A third microphone, error microphone E is provided in order to further improve the ANC operation by providing a measure of the ambient audio combined with the audio reproduced by speaker SPKR close to ear 5 at an error microphone reference position ERP, when wireless telephone 10 is in close proximity to ear 5. Exemplary circuits 14 within wireless telephone 10 include an audio CODEC integrated circuit 20 that receives the signals from reference microphone R, near speech microphone NS and error microphone E and interfaces with other integrated circuits such as a RF integrated circuit 12 containing the wireless telephone transceiver. In alternative implementations, the circuits and techniques disclosed herein may be incorporated in a single integrated circuit that contains control circuits and other functionality for implementing the entirety of the personal audio device, such as an MP3 player-on-a-chip integrated circuit.

In general, the ANC techniques of the present invention measure ambient acoustic events (as opposed to the output of speaker SPKR and/or the near-end speech) impinging on reference microphone R, and by also measuring the same ambient acoustic events impinging on error microphone E. The ANC processing circuits of illustrated wireless telephone 10 adapt an anti-noise signal generated from the output of reference microphone R to have a characteristic that minimizes the amplitude of the ambient acoustic events at error microphone E, i.e. at error microphone reference position ERP. Since acoustic path P(z) extends from reference microphone R to error microphone E, the ANC circuits are essentially estimating acoustic path P(z) combined with removing effects of an electro-acoustic path S(z) that represents the response of the audio output circuits of CODEC IC 20 and the acoustic/electric transfer function of speaker SPKR including the coupling between speaker SPKR and error microphone E in the particular acoustic environment. The coupling between speaker SPKR and error microphone E is affected by the proximity and structure of ear 5 and other physical objects and human head structures that may be in proximity to wireless telephone 10, when wireless telephone 10 is not firmly pressed to ear 5. Since the user of wireless telephone 10 actually hears the output of speaker SPKR at a drum reference position DRP, differences between the signal produced by error microphone E and what is actually heard by the user are shaped by the response of the ear canal, as well as the spatial distance between error microphone reference position ERP and drum reference position DRP. At higher frequencies, the spatial differences lead to multi-path nulls that reduce the effectiveness of the ANC system, and in some cases may increase ambient noise. While the illustrated wireless telephone 10 includes a two microphone ANC system with a third near speech microphone NS, some aspects of the techniques disclosed herein may be practiced in a system that does not include separate error and reference microphones, or a wireless telephone using near speech microphone NS to perform the function of the reference microphone R. Also, in personal audio devices designed only for audio playback, near speech microphone NS will generally not be included, and the near speech signal paths in the circuits described in further detail below can be omitted.

Figure 2:
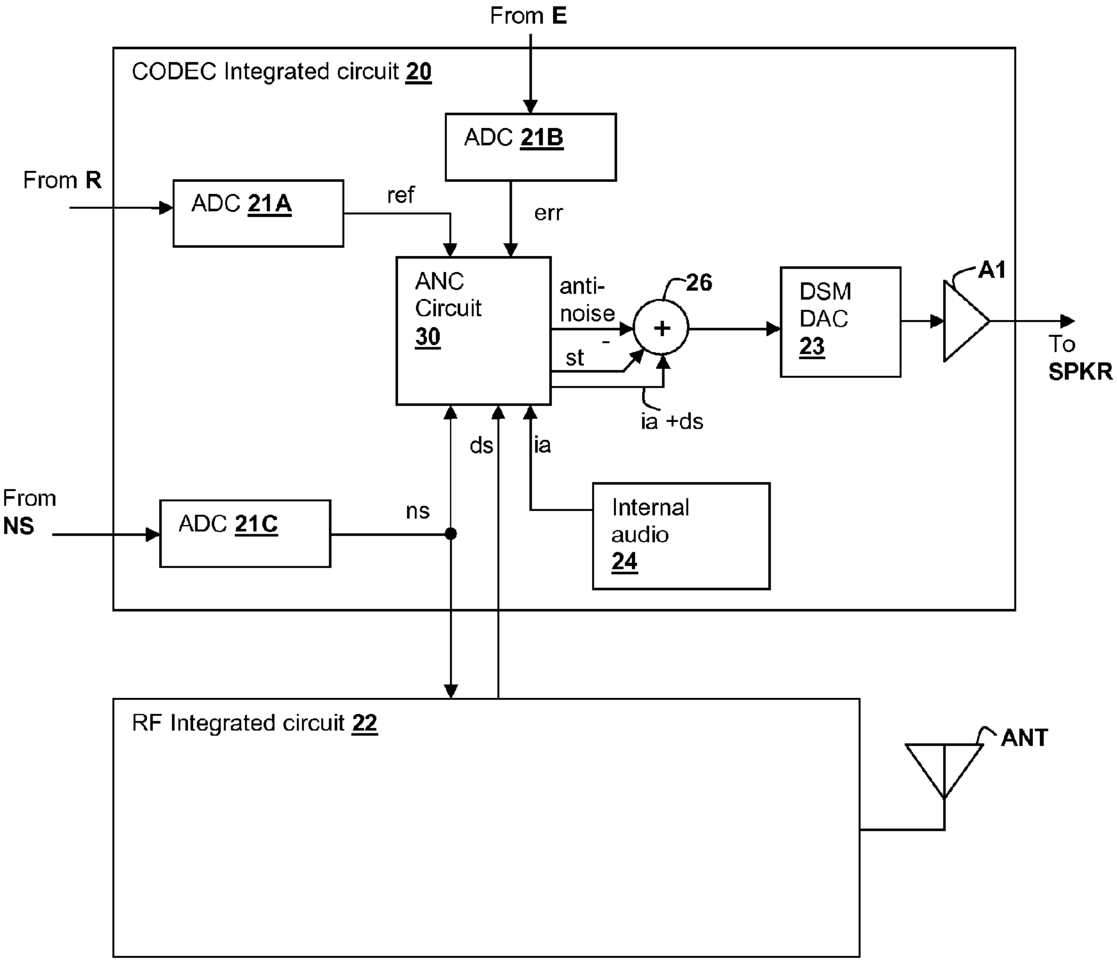
FIG. 2 is a block diagram of circuits within wireless telephone 10.

Referring now to FIG. 2, circuits within wireless telephone 10 are shown in a block diagram. The circuit shown in FIG. 2 further applies to the other configurations mentioned above, except that signaling between CODEC integrated circuit 20 and other units within wireless telephone 10 are provided by cables or wireless connections when CODEC integrated circuit 20 is located outside of wireless telephone 10. In such a configuration, signaling between CODEC integrated circuit 20 and error microphone E, reference microphone R and speaker SPKR are provided by wired or wireless connections when CODEC integrated circuit 20 is located within wireless telephone 10. CODEC integrated circuit 20 includes an analog-to-digital converter (ADC) 21A for receiving the reference microphone signal and generating a digital representation ref of the reference microphone signal. CODEC integrated circuit 20 also includes an ADC 21B for receiving the error microphone signal and generating a digital representation err of the error microphone signal, and an ADC 21C for receiving the near speech microphone signal and generating a digital representation ns of the error microphone signal. CODEC IC 20 generates an output for driving speaker SPKR from an amplifier A1, which amplifies the output of a delta-sigma modulated digital-to-analog converter (DAC) 23 that receives the output of a combiner 26. Combiner 26 combines audio signals is from internal audio sources 24, and the anti-noise signal anti-noise generated by an ANC circuit 30, which by convention has the same polarity as the noise in reference microphone signal ref and is therefore subtracted by combiner 26. Combiner 26 also combines an attenuated portion of near speech signal ns, i.e., sidetone information st, so that the user of wireless telephone 10 hears their own voice in proper relation to downlink speech ds, which is received from a radio frequency (RF) integrated circuit 22. Near speech signal ns is also provided to RF integrated circuit 22 and is transmitted as uplink speech to the service provider via an antenna ANT.

Figure 3:
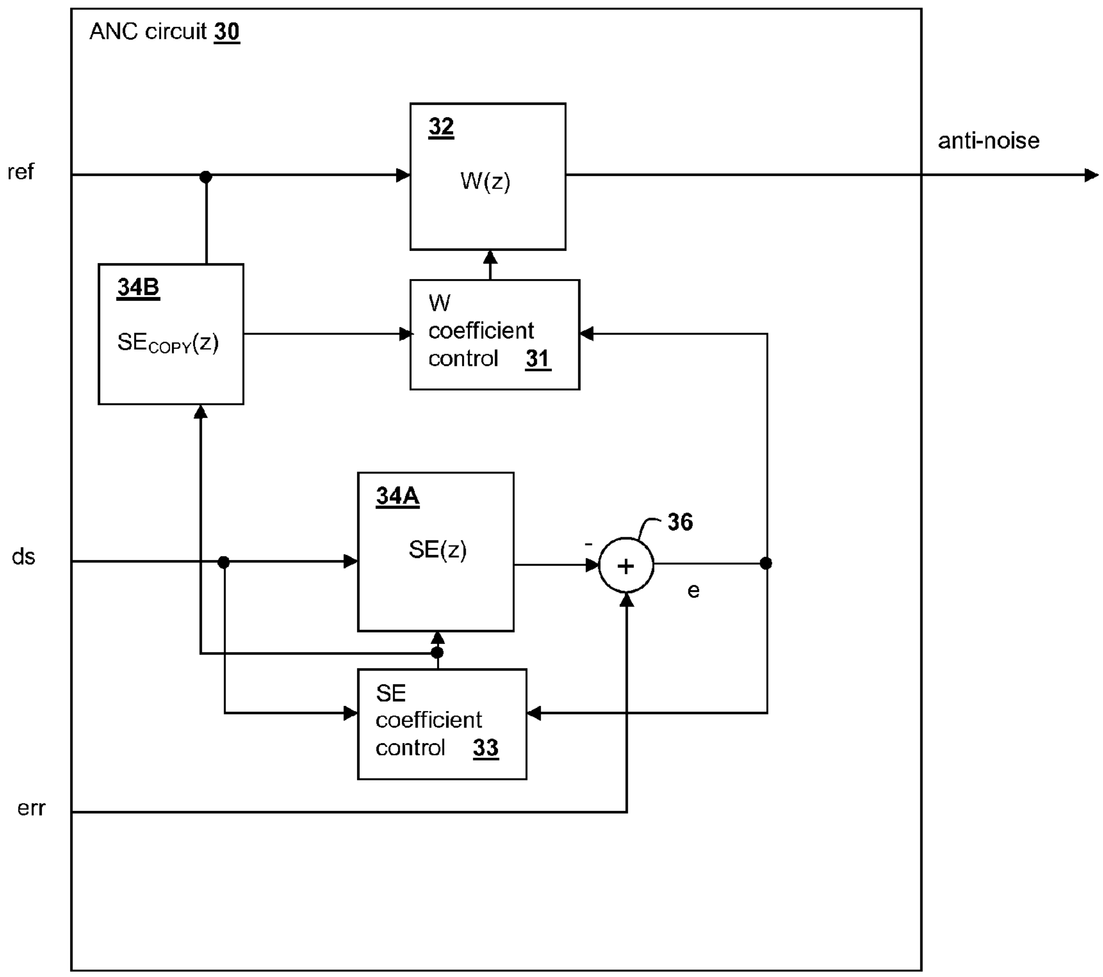
FIG. 3 is a block diagram depicting signal processing circuits and functional blocks of various exemplary ANC circuits that can be used to implement ANC circuit 30 of CODEC integrated circuit 20 of FIG. 2.

Referring now to FIG. 3, an example of details of an ANC circuit 30A that can be used to implement ANC circuit 30 of FIG. 2 are shown. An adaptive filter 32 receives reference microphone signal ref and under ideal circumstances, adapts its transfer function W(z) to be P(z)/S(z) to generate the anti-noise signal. The coefficients of adaptive filter 32 are controlled by a W coefficient control block 31 that uses a correlation of two signals to determine the response of adaptive filter 32, which generally minimizes, in a least-mean squares sense, those components of reference microphone signal ref that are present in error microphone signal err. The signals provided as inputs to W coefficient control block 31 are the reference microphone signal ref as shaped by a copy of an estimate of the response of path S(z) provided by a filter 34B and another signal provided from the output of a combiner 36 that includes error microphone signal err and an inverted amount of downlink audio signal ds that has been processed by filter response SE(z), of which response $SE_{COPY}(z)$ is a copy. By transforming the inverted copy of downlink audio signal ds with the estimate of the response of path S(z), the downlink audio that is removed from error microphone signal err before comparison should match the expected version of downlink audio signal ds reproduced at error microphone signal err, since the electrical and acoustical path of S(z) is the path taken by downlink audio signal ds to arrive at error microphone E. Combiner 36 combines error microphone signal err and the inverted downlink audio signal ds to produce an error signal e. By transforming reference microphone signal ref with a copy of the estimate of the response of path S(z), $SE_{COPY}(z)$, and minimizing the portion of the error signal that correlates with components of reference microphone signal ref, adaptive filter 32 adapts to the desired response of P(z)/S(z). By removing downlink audio signal ds from error signal e, adaptive filter 32 is prevented from adapting to the relatively large amount of downlink audio present in error microphone signal err.

To implement the above, an adaptive filter 34A has coefficients controlled by a SE coefficient control block 33, which updates based on correlated components of downlink audio signal ds and an error value. SE coefficient control block 33 correlates the actual downlink speech signal ds with the components of downlink audio signal ds that are present in error microphone signal err. Adaptive filter 34A is thereby adapted to generate a signal from downlink audio signal ds, that when subtracted from error microphone signal err, contains the content of error microphone signal err that is not due to downlink audio signal ds in error signal e.

Figure 4A:
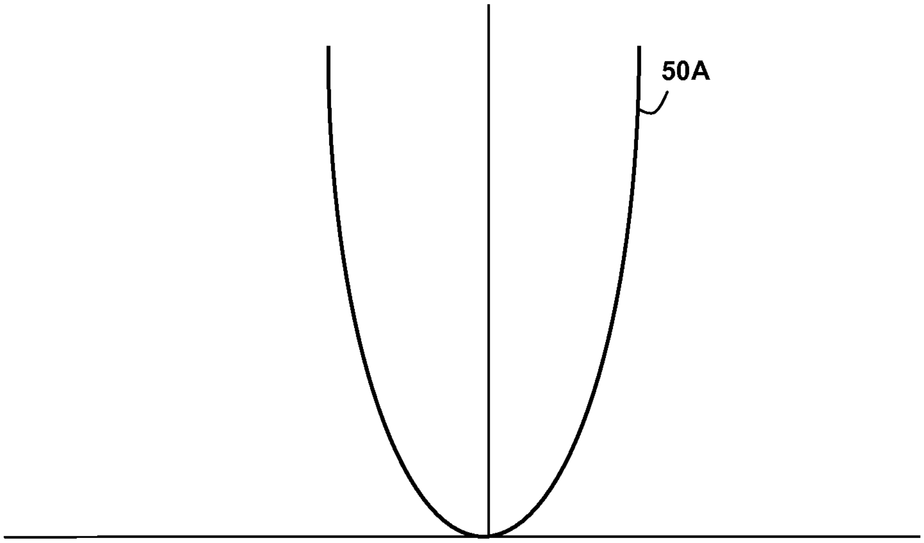
FIG. 4A is a graph showing a typical cost function of a least-mean-squares (LMS) control block.
Figure 4B:
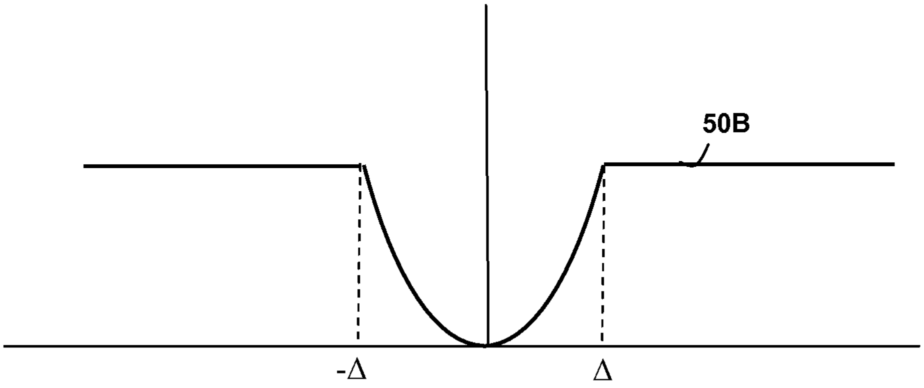
FIG. 4B is a graph showing a modified cost function as implemented in one or both of W coefficient control block 31 and SE coefficient control block 33 of FIG. 3.

Under certain conditions, such as near speech or wind noise entering reference microphone R and/or error microphone E, or when mechanical events occur such as the listener's fingernails scratching on the housing of wireless telephone 10, response W(z) can become unstable, and the coefficient values produced by W coefficient control block 31 can quickly deviate from values that will provide proper noise cancellation. FIG. 4A shows a typical cost function 50A, which is the measure of the mean-square error that is generally minimized by adaptive filter coefficient control blocks having least-means-squared (LMS) adaptive control implementations. The value of the cost function 50A is proportional to $e^2$, where e is the measured error and thus function 50A is a parabolic response that becomes increasingly steeper as the error increases. However, in coefficient control block 31, the cost function has been modified as shown in FIG. 4B so that if the error e exceeds a threshold Δ in either the positive or negative direction, a cost function 50B is clamped at the value of the cost function at the threshold and adaptation is halted. The rule for adaptation is as follows where:

$$\nabla(f(e(n)))_w \Longrightarrow \begin{cases} 0 & |e(n)| \geq \Delta \\ 2e(n)\cdot\dfrac{\partial e}{\partial w} = 2e(n)X & |e(n)| < \Delta \end{cases}$$

Do NOT adapt when $|e(n)| \geq \Delta$

Where $f(e(n))$ is the cost function that is minimized by the adaptive filter control loop. The resulting operation prevents sudden events such as near speech and the mechanical noises and wind noise mentioned above, from reacting to error e(n) having a magnitude that exceeds threshold Δ, which adds to robustness of the ANC operation. Because thresholds Δ and −Δ are applied to the computed error, the reaction of W coefficient control block 31 and SE coefficient control block 33 can be on a per-update basis, which could be as frequent as once-per-input-sample.

Effectively, samples that would cause the error e to exceed the threshold values Δ or −Δ will be discarded, preventing them from contributing to error and instability. A larger group of samples could be used, so that a control of the size of a tolerated disturbance could be adjusted. The technique described herein provides a measure of a peak-to-average ratio of the error, and other such measurements could be used. In one implementation, observing the error with two different time constants gives a measure of change due to instability. For example, the comparison of individual samples of the error to the local average error can be used to trigger rejection of samples containing a disturbance. Non-linear filtering, e.g., rules such as: "ignore the next n samples when the threshold has crossed" could be used to provide additional filtering. Threshold Δ can be variable, and set according to the amplitude of ambient noise. Similarly, the same sort of threshold application, with potentially different thresholds, can be applied within SE coefficient control block 33, in which case the threshold can be based upon the magnitude of the training signal, e.g., source audio (ds+ia).

Figure 5:
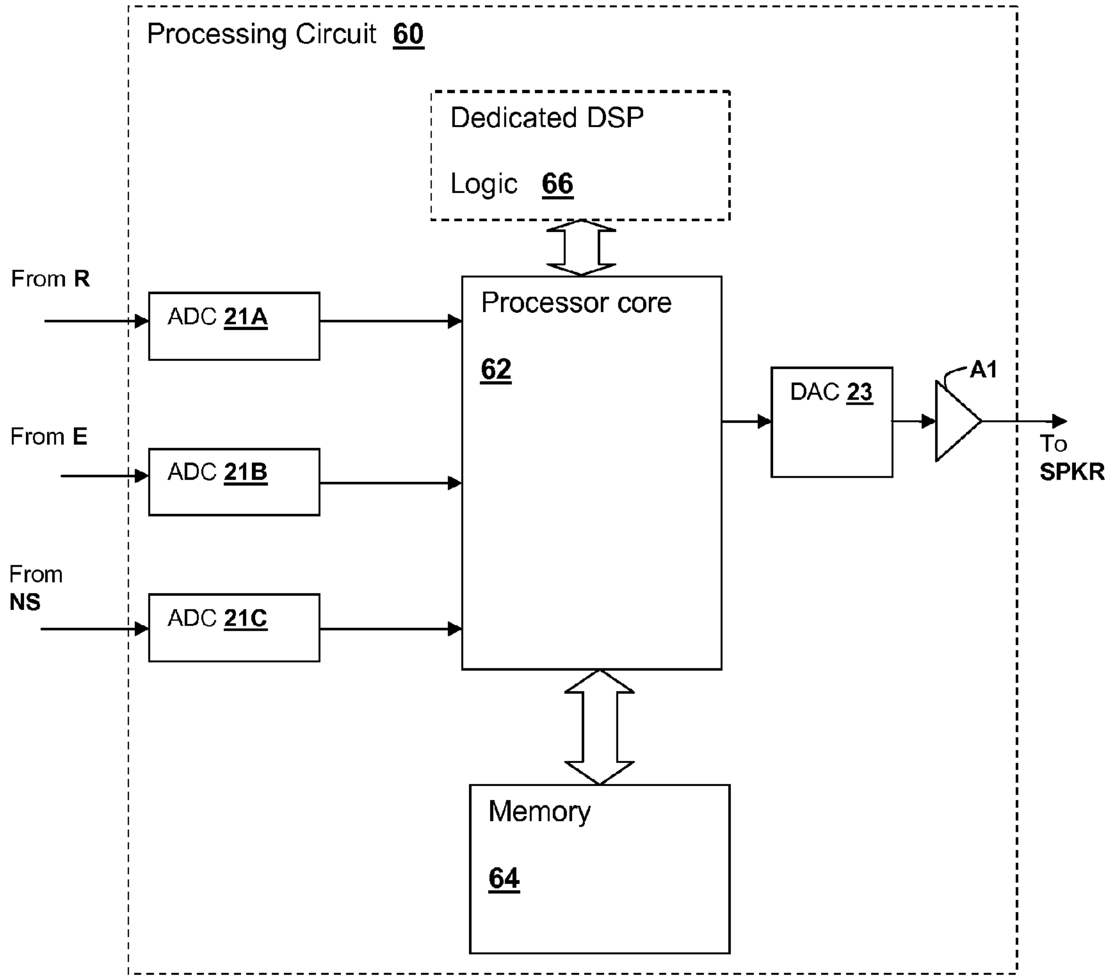
FIG. 5 is a block diagram depicting signal processing circuits and functional blocks within CODEC integrated circuit 20.

Referring now to FIG. 5, a block diagram of an ANC system is shown for implementing ANC techniques as depicted in FIG. 3, and having a processing circuit 60 as may be implemented within CODEC integrated circuit 20 of FIG. 2. Processing circuit 60 includes a processor core 62 coupled to a memory 64 in which are stored program instructions comprising a computer-program product that may implement some or all of the above-described ANC techniques, as well as other signal processing. Optionally, a dedicated digital signal processing (DSP) logic 66 may be provided to implement a portion of, or alternatively all of, the ANC signal processing provided by processing circuit 60. Processing circuit 60 also includes ADCs 21A-21C, for receiving inputs from reference microphone R, error microphone E and near speech microphone NS, respectively. In alternative embodiments in which one or more of reference microphone R, error microphone E and near speech microphone NS have digital outputs, the corresponding ones of ADCs 21A-21C are omitted and the digital microphone signal(s) are interfaced directly to processing circuit 60. DAC 23 and amplifier A1 are also provided by processing circuit 60 for providing the speaker output signal, including anti-noise as described above. The speaker output signal may be a digital output signal for provision to a module that reproduces the digital output signal acoustically.

While the invention has been particularly shown and described with reference to the preferred embodiments thereof, it will be understood by those skilled in the art that the foregoing and other changes in form, and details may be made therein without departing from the spirit and scope of the invention.

The invention claimed is:

1. A personal audio device, comprising:

a personal audio device housing;

a transducer mounted on the housing for reproducing an audio signal including both source audio for playback to a listener and an anti-noise signal for countering effects of ambient audio sounds in an acoustic output of the transducer;

a reference microphone mounted on the housing for providing a reference microphone signal indicative of the ambient audio sounds;

an error microphone mounted on the housing in proximity to the transducer for providing an error microphone signal indicative of the acoustic output of the transducer and the ambient audio sounds at the transducer; and a processing circuit that adaptively generates the anti-noise signal from the reference microphone signal by adapting a first adaptive filter to reduce the presence of the ambient audio sounds heard by the listener in conformity with an error signal and the reference microphone signal, wherein the processing circuit implements a secondary path filter having a secondary path response that shapes the source audio and a combiner that removes the source audio from the error microphone signal to provide the error signal, and wherein the processing circuit adapts coefficients of the first adaptive filter according to the reference microphone signal and the error signal, and wherein if a magnitude of a value derived from the error microphone signal has a rate of change that exceeds a threshold value indicating a spike in the ambient audio sounds, the processing circuit alters adaptation of the first adaptive filter to reduce disruption in values of the coefficients caused by the spike in the ambient audio sounds.

2. The personal audio device of claim 1, wherein the processing circuit determines an average level of the ambient audio sounds from an average of the value derived from the error microphone signal, and determines the rate of change of the magnitude of the value derived from the error microphone signal from a difference between the average level of the value derived from the error microphone signal and an instantaneous value of the magnitude of the value derived from the error microphone signal.

3. The personal audio device of claim 2, wherein the processing circuit determines the instantaneous value of the magnitude of the value derived from the error microphone signal from groups of samples of the value derived from the error microphone signal having a size that is smaller than the size of the groups of samples used to determine the average of the value derived from the error microphone signal.

4. The personal audio device of claim 3, wherein the processing circuit compares the magnitude of the value derived from the error microphone signal to the average level at each sample of the error microphone signal, wherein the processing circuit skips updates due to samples for which the magnitude of the value derived from the error microphone signal exceeds the threshold value.

5. The personal audio device of claim 1, wherein the processing circuit alters adaptation of the first adaptive filter by not updating coefficients of the first adaptive filter when the rate of change of the magnitude of the value derived from the error microphone signal exceeds the threshold value.

6. A method of countering effects of ambient audio sounds by a personal audio device, the method comprising:

adaptively generating an anti-noise signal from a reference microphone signal by adapting a first adaptive filter to reduce the presence of the ambient audio sounds heard by the listener in conformity with an error signal and the reference microphone signal;

combining the anti-noise signal with source audio;

providing a result of the combining to a transducer;

measuring the ambient audio sounds with a reference microphone;

measuring an acoustic output of the transducer and the ambient audio sounds with an error microphone;

filtering the source audio with a secondary path filter having a secondary path response to produce filtered source audio;

removing the filtered source audio from the error microphone signal to generate the error signal;

adapting coefficients of the first adaptive filter according to the reference microphone signal and the error signal;

detecting a spike in the ambient audio sounds by determining whether the magnitude of a value derived from the error microphone signal has a rate of change that exceeds a threshold value; and responsive to the detecting having detected a spike, altering the adapting of the coefficients to reduce disruption in values of the coefficients caused by the spike.

7. The method of claim 6, further comprising:

determining an average level of the ambient audio sounds from an average of the value derived from the error microphone signal; and determining the rate of change of the magnitude of the value derived from the error microphone signal from a difference between the average level of the value derived from the error microphone signal and an instantaneous value of the magnitude of the value derived from the error microphone signal.

8. The method of claim 7, further comprising determining the instantaneous value of the magnitude of the value derived from the error microphone signal from groups of samples of the value derived from the error microphone signal having a size that is smaller than the size of the groups of samples used to determine the average of the value derived from the error microphone signal.

9. The method of claim 8, further comprising:

comparing the magnitude of the value derived from the error microphone signal to the average level at each sample of the error microphone signal; and skipping updates to the adapting of the coefficients due to samples for which the magnitude of the value of derived from the error microphone signal exceeds the threshold value.

10. The method of claim 6, further comprising altering adaptation of the first adaptive filter by the adapting of the coefficients not updating coefficients of the first adaptive filter when the rate of change of the magnitude of the value derived from the error microphone signal exceeds the threshold value.

11. An integrated circuit for implementing at least a portion of a personal audio device, comprising:

an output for providing an output signal to an output transducer including both source audio for playback to a listener and an anti-noise signal for countering effects of ambient audio sounds in an acoustic output of the transducer;

a reference microphone input for receiving a reference microphone signal indicative of the ambient audio sounds;

an error microphone input for receiving an error microphone signal indicative of the acoustic output of the transducer and the ambient audio sounds at the transducer; and a processing circuit that adaptively generates the anti-noise signal from the reference microphone signal by adapting a first adaptive filter to reduce the presence of the ambient audio sounds heard by the listener in conformity with an error signal and the reference microphone signal, wherein the processing circuit implements a secondary path filter having a secondary path response that shapes the source audio and a combiner that removes the source audio from the error microphone signal to provide the error signal, and wherein the processing circuit adapts coefficients of the first adaptive filter according to the reference microphone signal and the error signal, and wherein if a magnitude of a value derived from the error microphone signal has a rate of change that exceeds a threshold value indicating a spike in the ambient audio sounds, the processing circuit alters adaptation of the first adaptive filter to reduce disruption in values of the coefficients caused by the spike in the ambient audio sounds.

12. The integrated circuit of claim 11, wherein the processing circuit determines an average level of the ambient audio sounds from an average of the value derived from the error microphone signal, and determines the rate of change of the magnitude of the value derived from the error microphone signal from a difference between the average level of the value derived from the error microphone signal and an instantaneous value of the magnitude of the value derived from the error microphone signal.

13. The integrated circuit of claim 12, wherein the processing circuit determines the instantaneous value of the magnitude of the value derived from the error microphone signal from groups of samples of the value derived from the error microphone signal having a size that is smaller than the size of the groups of samples used to determine the average of the value derived from the error microphone signal.

14. The integrated circuit of claim 13, wherein the processing circuit compares the magnitude of the value derived from the error microphone signal to the average level at each sample of the error microphone signal, wherein the processing circuit skips updates due to samples for which the magnitude of the value of derived from the error microphone signal exceeds the threshold value.

15. The integrated circuit of claim 11, wherein the processing circuit alters adaptation of the first adaptive filter by not updating coefficients of the first adaptive filter when the rate of change of the magnitude of the value derived from the error microphone signal exceeds the threshold value.

* * * * *